United States Patent
Min et al.

(10) Patent No.: US 10,249,735 B2
(45) Date of Patent: Apr. 2, 2019

(54) THIN FILM TRANSISTOR, METHOD FOR MANUFACTURING THE SAME, ARRAY SUBSTRATE, AND DISPLAY DEVICE

(71) Applicant: BOE TECHNOLOGY GROUP CO., LTD., Beijing (CN)

(72) Inventors: Jian Min, Beijing (CN); Xiaolong Li, Beijing (CN); Zhengyin Xu, Beijing (CN); Ping Song, Beijing (CN); Youwei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/236,696

(22) Filed: Aug. 15, 2016

(65) Prior Publication Data

US 2017/0256631 A1    Sep. 7, 2017

(30) Foreign Application Priority Data

Mar. 4, 2016   (CN) .......................... 2016 1 0124743

(51) Int. Cl.
| | |
|---|---|
| *H01L 21/02* | (2006.01) |
| *H01L 29/66* | (2006.01) |
| *H01L 21/28* | (2006.01) |
| *H01L 21/3105* | (2006.01) |
| *H01L 27/12* | (2006.01) |

(Continued)

(52) U.S. Cl.
CPC .. *H01L 29/66765* (2013.01); *H01L 21/02532* (2013.01); *H01L 21/02592* (2013.01); *H01L 21/02675* (2013.01); *H01L 21/28008* (2013.01); *H01L 21/31053* (2013.01); *H01L 27/1218* (2013.01); *H01L 27/1229* (2013.01); *H01L 27/1262* (2013.01); *H01L 27/1296* (2013.01); *H01L 29/42384* (2013.01); *H01L 29/78618* (2013.01); *H01L 29/78636* (2013.01); *H01L 29/78678* (2013.01)

(58) Field of Classification Search
CPC ......... H01L 21/02595; H01L 21/02532; H01L 21/02592; H01L 21/02675
See application file for complete search history.

(56) References Cited

U.S. PATENT DOCUMENTS

| | | |
|---|---|---|
| 6,100,954 A | 8/2000 | Kim et al. |
| 9,595,435 B2 * | 3/2017 | Tsubuku .......... H01L 21/02422 |
| 2006/0054885 A1 | 3/2006 | Seo et al. |

(Continued)

FOREIGN PATENT DOCUMENTS

| | | |
|---|---|---|
| CN | 1750290 A | 3/2006 |

OTHER PUBLICATIONS

First Office Action for Chinese Application No. 201610124743.9, dated Jan. 23, 2018, 7 Pages.

*Primary Examiner* — Douglas M Menz
(74) *Attorney, Agent, or Firm* — Brooks Kushman P.C.

(57) ABSTRACT

The present disclosure provides a TFT, its manufacturing method, an array substrate and a display device. The method includes steps of: forming a pattern of a gate electrode on a base substrate; forming a gate insulation layer with an even surface; forming a pattern of a polysilicon semiconductor layer; and forming patterns of a source electrode and a drain electrode. The step of forming the pattern of the polysilicon semiconductor layer includes: crystallizing the amorphous silicon layer, so as to form the polysilicon semiconductor layer.

11 Claims, 4 Drawing Sheets

(51) Int. Cl.
*H01L 29/786* (2006.01)
*H01L 29/423* (2006.01)

(56) References Cited

U.S. PATENT DOCUMENTS

| | | | |
|---|---|---|---|
| 2006/0160281 A1* | 7/2006 | Huang | H01L 29/66757 438/149 |
| 2012/0097962 A1* | 4/2012 | Joo | H01L 21/28008 257/66 |
| 2014/0113405 A1 | 4/2014 | Tsubuku et al. | |

* cited by examiner

THIN FILM TRANSISTOR, METHOD FOR MANUFACTURING THE SAME, ARRAY SUBSTRATE, AND DISPLAY DEVICE

CROSS-REFERENCE TO RELATED APPLICATIONS

This application claims priority to Chinese application No. 201610124743.9, filed Mar. 4, 2016, which is hereby incorporated by reference in its entirety.

TECHNICAL FIELD

The present disclosure relates to the field of display technology, in particular to a thin film transistor (TFT), a method for manufacturing the same, an array substrate and a display device.

BACKGROUND

Usually, a bottom-gate low-temperature polysilicon (LTPS) TFT includes a gate electrode, a gate insulation layer, a polysilicon semiconductor layer, a source electrode and a drain electrode. An amorphous silicon layer is formed at first, and then subjected to excimer laser annealing (ELA) treatment, so as to form the polysilicon semiconductor layer. The gate electrode is arranged under the gate insulation layer, and the gate insulation layer may include a protrusion at a position corresponding to the gate electrode. The flatness of the amorphous silicon layer may be adversely affected due to the protrusion, and during the ELA treatment, a crystallization effect may get worse. As a result, the resultant LTPS TFT may be provided with instable properties.

SUMMARY

An object of the present disclosure is to provide a TFT, its manufacturing method, an array substrate and a display device, so as to provide an even amorphous silicon layer, thereby to improve the crystallization effect as well as the properties of the LTPS TFT.

In one aspect, the present disclosure provides in some embodiments a method for manufacturing a TFT, including steps of: forming a pattern of a gate electrode on a base substrate; forming a gate insulation layer with an even surface; forming a pattern of a polysilicon semiconductor layer; and forming patterns of a source electrode and a drain electrode. The step of forming the pattern of the polysilicon semiconductor layer includes: depositing an amorphous silicon layer; crystallizing the amorphous silicon layer, so as to form the polysilicon semiconductor layer; and patterning the polysilicon semiconductor layer to form the pattern of the polysilicon semiconductor layer.

Optionally, the step of forming the gate insulation layer with the even surface includes: depositing a gate insulation layer film having a thickness greater than or equal to a sum of a desired thickness of the gate insulation layer and a thickness of the gate electrode; and removing a protrusion on the gate insulation layer film so as to form the gate insulation layer with the even surface.

Optionally, the protrusion on the gate insulation layer film is removed by chemical-mechanical polishing.

Optionally, subsequent to the step of forming the pattern of the polysilicon semiconductor layer and prior to the step of forming the patterns of the source electrode and the drain electrode, the method further includes: depositing an amorphous silicon doped layer; and patterning the amorphous silicon doped layer to form a pattern of the amorphous silicon doped layer at a source electrode contact region and a drain electrode contact region on the polysilicon semiconductor layer.

Optionally, the amorphous silicon doped layer is an amorphous silicon highly-doped P+ layer.

Optionally, the base substrate is a flexible base substrate.

Optionally, the amorphous silicon layer is crystallized through ELA.

Optionally, the step of forming the pattern of the polysilicon semiconductor layer includes: depositing an amorphous silicon layer; patterning the amorphous silicon layer to form a pattern of the amorphous silicon layer; and crystallizing the pattern of the amorphous silicon layer so as to form the pattern of the amorphous silicon semiconductor layer.

Optionally, the pattern of the amorphous silicon layer is crystallized through ELA.

Optionally, prior to the step of forming the gate electrode on the base substrate, the method further includes depositing a buffer layer made of $SiO_x$, or SiNx on the base substrate.

In another aspect, the present disclosure provides in some embodiments a TFT, including: a base substrate; a gate electrode arranged on the base substrate; a gate insulation layer with an even surface and arranged on the gate electrode; a polysilicon semiconductor layer arranged on the gate insulation layer; and a source electrode and a drain electrode arranged on the polysilicon semiconductor layer.

Optionally, the TFT further includes an amorphous silicon doped layer which is arranged at a source electrode contact region and a drain electrode contact region on the polysilicon semiconductor layer and which is in contact with the source electrode and the drain electrode.

Optionally, the amorphous silicon doped layer is an amorphous silicon highly-doped $P^+$ layer.

Optionally, the base substrate is a flexible base substrate.

Optionally, the TFT further includes a buffer layer arranged on the base substrate.

Optionally, the gate insulation layer with the even surface covers the gate electrode and the buffer layer.

In yet another aspect, the present disclosure provides in some embodiments an array substrate including the above-mentioned TFT.

In still yet another aspect, the present disclosure provides in some embodiments a display device including the above-mentioned array substrate.

According to the embodiments of the present disclosure, the gate insulation layer has the even surface, so the amorphous silicon layer on the gate insulation layer has an even surface too. As a result, it is able to improve the crystallization effect of the amorphous silicon layer, thereby to improve the properties of the LTPS TFT.

Figure 1:
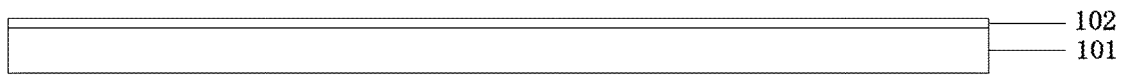
FIGS. 1-11 are schematic views showing a method for manufacturing an LTPS TFT in some embodiments of the present disclosure.

REFERENCE SIGN LIST 101 rigid substrate
102 flexible substrate
103 buffer layer
104 gate electrode
105 gate insulation layer film 105' gate insulation layer
106 amorphous silicon layer
106' polysilicon semiconductor layer
106" pattern of polysilicon semiconductor layer
107 pattern of amorphous silicon highly-doped P+ layer
108A source electrode
108B drain electrode

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In the related art, during the crystallization of an amorphous silicon layer into a polysilicon layer, the crystallization effect may be adversely affected due to the uneven amorphous silicon layer, and thereby the properties of the LTPS TFT may be adversely affected too. In order to overcome this drawback, the present disclosure provides in some embodiments a method for manufacturing a TFT, which includes: Step S11 of forming a pattern of a gate electrode on a base substrate; Step S12 of forming a gate insulation layer with an even surface; Step S13 of forming a pattern of a polysilicon semiconductor layer; and Step S14 of forming patterns of a source electrode and a drain electrode. Step S13 includes crystallizing an amorphous silicon layer, so as to form the polysilicon semiconductor layer.

According to the embodiments of the present disclosure, the gate insulation layer has the even surface, so the amorphous silicon layer on the gate insulation layer has an even surface too. As a result, it is able to improve the crystallization effect of the amorphous silicon layer, thereby to improve the properties of the LTPS TFT.

The step of forming the gate insulation layer with the even surface will be described in more details hereinafter.

In some embodiments of the present disclosure, the step of forming the gate insulation layer with the even surface includes: Step S121 of depositing a gate insulation layer film having a thickness greater than or equal to a sum of a desired thickness of the gate insulation layer and a thickness of the gate electrode; and Step S122 of removing a protrusion on the gate insulation layer film so as to form the gate insulation layer with the even surface.

In other words, the gate insulation layer film may be deposited at first, and at this time, the gate insulation layer film may include the protrusion at a position corresponding to the gate electrode. Then, the protrusion may be removed, so as to form the gate insulation layer with the even surface.

As compared with a conventional process for forming the gate insulation layer, in some embodiments of the present disclosure, it is merely required to further deposit a gate insulation layer film of a certain thickness and then remove the protrusion on the gate insulation layer, so there is no big change to the conventional process.

Of course, in some other embodiments of the present disclosure, the gate insulation layer with the even surface may be formed in any other ways.

Optionally, the protrusion on the gate insulation layer film may be removed by chemical-mechanical polishing. For chemical polishing, it may provide high surface accuracy and prevent the occurrence of surface/subsurface damage, but with relatively low polishing rate and polishing efficiency. In addition, it is impossible to modify the surface profile, and portions of the layer may not be polished evenly. For mechanical polishing, the portions of the layer may be polished evenly at relatively high polishing efficiency, and the surface profile may be modified to provide a flat surface. However, the surface/subsurface damage may easily occur, and the surface roughness is relatively low. In the embodiments of the present disclosure, by combining the chemical polishing and the mechanical polishing, it is able to ensure the polishing efficiency, improve the surface flatness by one or two orders of magnitude, and provide the surface roughness at a nanoscale or atomic scale.

Of course, in some other embodiments of the present disclosure, the chemical polishing or the mechanical polishing may also be used, so as to remove the protrusion on the gate insulation layer film.

In some embodiments of the present disclosure, the step of forming the pattern of the polysilicon semiconductor layer may include: Step S131 of depositing an amorphous silicon layer; Step S132 of crystallizing the amorphous silicon layer, so as to form the polysilicon semiconductor layer; and Step S133 of patterning the polysilicon semiconductor layer, so as to form the pattern of the polysilicon semiconductor layer.

Optionally, the amorphous silicon layer may be crystallized through ELA.

Here, the amorphous silicon layer is crystallized to form the polysilicon semiconductor layer, and then the polysilicon semiconductor layer is patterned so as to form the pattern of the polysilicon semiconductor layer. In addition, through the ELA, it is able to prevent a layer under the amorphous silicon layer from being damaged.

In some other embodiments of the present disclosure, the step of forming the pattern of the polysilicon semiconductor layer may include: Step S131' of depositing an amorphous silicon layer; Step S132' of patterning the amorphous silicon layer to form a pattern of the amorphous silicon layer; and Step S133' of crystallizing the pattern of the amorphous silicon layer so as to form the pattern of the amorphous silicon semiconductor layer.

Optionally, the amorphous silicon layer may be crystallized through ELA.

Here, the amorphous silicon layer is patterned so as to form the pattern of the amorphous silicon layer, and then the patterned amorphous silicon layer is crystallized to form pattern of the polysilicon semiconductor layer. In addition, through the ELA, it is able to prevent a layer under the amorphous silicon layer from being damaged. In some embodiments of the present disclosure, a region beyond the amorphous silicon layer may be shielded by a shielding plate during the ELA.

In some embodiments, in order to further improve the properties of the LTPS TFT, an ohmic contact layer may be formed between the polysilicon semiconductor layer and the source/drain electrodes to reduce resistances of contact areas therebetween.

In other words, subsequent to the step of forming the pattern of the polysilicon semiconductor layer and prior to the step of forming the patterns of the source electrode and the drain electrode, the method further includes: Step S21 of depositing an amorphous silicon doped layer; and Step S22 of patterning the amorphous silicon doped layer to form a pattern of the amorphous silicon doped layer at a source electrode contact region and a drain electrode contact region on the polysilicon semiconductor layer.

Optionally, the amorphous silicon doped layer is an amorphous silicon highly-doped P+ layer.

The amorphous silicon doped layer is just the ohmic layer, and it is used to reduce resistances of contact areas between the polysilicon semiconductor layer and the source/drain electrodes.

In some embodiments of the present disclosure, the amorphous silicon layer may be deposited at first, and the amorphous silicon layer may be subjected to ion injection to form the ohmic contact layer. However, after the ion injection, the amorphous silicon layer needs to be subjected to activation treatment at a high temperature. Hence, this process cannot be used for the LTPS TFT with a flexible base substrate.

Through directly depositing the amorphous silicon doped layer, no activation treatment at a high temperature is desired, so it may be used for the LTPS TFT with a flexible base substrate. In addition, through the amorphous silicon doped layer which may be used to improve the ohmic contact, it is able to improve the crystallization effect of the amorphous silicon layer.

Optionally, the base substrate may be a flexible base substrate, i.e., the LTPS TFT may be a flexible LTPS TFT, which may be used for a flexible display device. The flexible display device is a display device which may be curved randomly or at a certain form under a certain condition, and it may be widely applied to a wearable device, or in health care or military field.

Of course, in some other embodiments of the present disclosure, the base substrate may also be a rigid base substrate.

The present disclosure will be described hereinafter in conjunction with the drawings and embodiments. The following embodiments are for illustrative purposes only, but shall not be used to limit the scope of the present disclosure.

Referring to FIGS. 1-11, the method includes the following steps.

Step S31: referring to FIG. 1, forming a flexible substrate 102 on a rigid substrate 101. The rigid substrate 101 may be a glass substrate, and the flexible substrate 102 may be made of polyimide and have a thickness of 5 to 15 μm.

Figure 2:
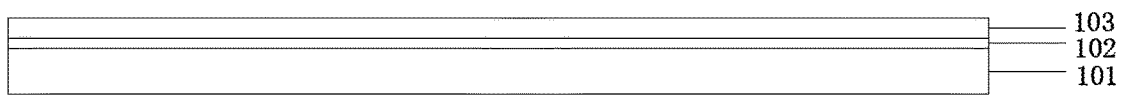

Step S32: referring to FIG. 2, forming a buffer layer 103 on the flexible substrate 102. To be specific, the buffer layer 103 may be formed by deposition, it may consist of a SiOx layer, a SiNx layer, or both, and have a thickness of 1000 Å to 10000 Å. The buffer layer 103 may function as a barrier layer and a planarization layer, and may be used to release a stress between the layers.

Figure 3:
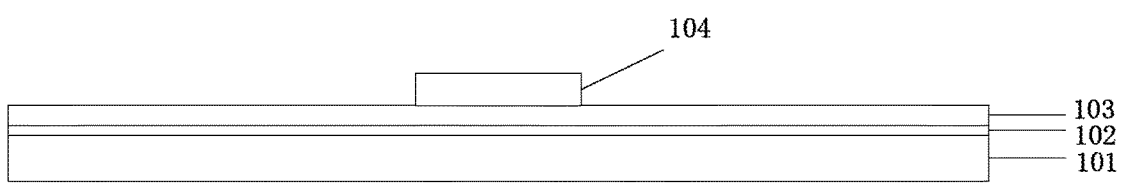

Step S33: referring to FIG. 3, forming a pattern of a gate electrode layer 104 on the buffer layer 103. To be specific, a gate metal layer having a thickness of 800 Å to 2000 Å may be deposited by magnetron sputtering. The gate metal layer may be made of Al, Mo, Cu or W, or an alloy thereof. After the deposition, the gate metal layer may be patterned by a patterning process (including exposing, developing and etching), so as to form the pattern of the gate electrode 104.

Figure 4:
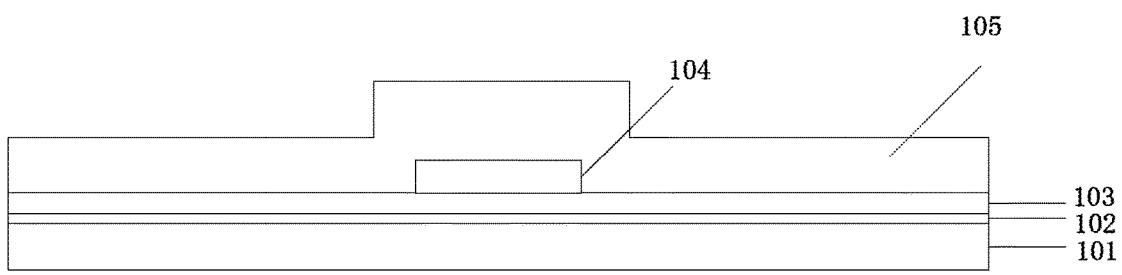

Step S34: referring to FIG. 4, depositing a gate insulation layer film 105 on the gate electrode 104. The gate insulation layer film 105 has a thickness greater than or equal to a sum of a desired thickness of the gate insulation layer and a thickness of the gate electrode 104. To be specific, the gate insulation layer film 105 may be deposited by plasma enhanced chemical vapor deposition (PECVD). It may consist of a SiOx layer, a SiNx layer, or both, and have a thickness greater than or equal to a sum of a desired thickness of the gate insulation layer and a thickness of the gate electrode 104. For example, in the case that the gate electrode has a thickness of 1000 Å and the gate insulation layer has a desired thickness of 2000 Å, then the thickness of the gate insulation layer film may be greater than or equal to 3000 Å. The thickness of the gate insulation layer film may be selected in accordance with the practical need.

Figure 5:
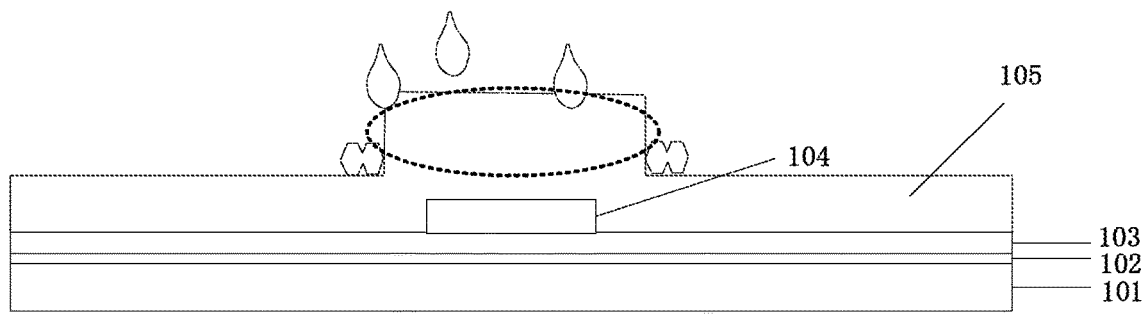
Figure 6:
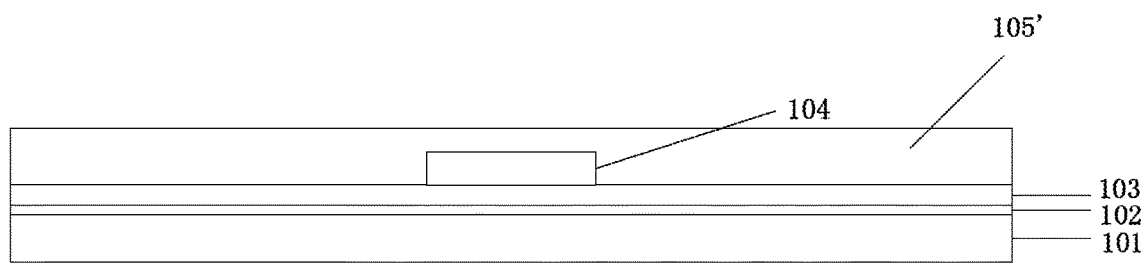

Step S35: referring to FIGS. 5 and 6, removing a protrusion on the gate insulation layer film 105 by chemical-mechanical polishing, so as to form a gate insulation layer 105' with an even surface, thereby to facilitate the crystallization of the subsequently-formed amorphous silicon layer.

Figure 7:
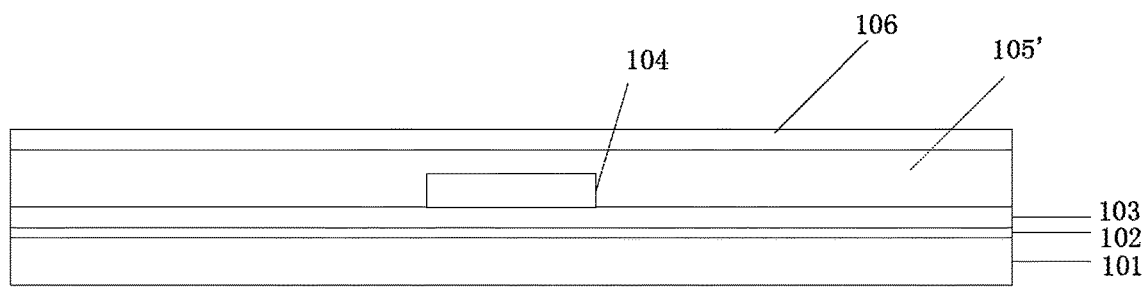

Step S36: referring to FIG. 7, depositing an amorphous silicon layer 106 on the gate insulation layer 105'. To be specific, the amorphous silicon layer 106 having a thickness of 300 Å to 1000 Å may be deposited at a temperature less than 400° C., and then dehydrogenated and annealed at a temperature approximate to 400° C. for more than 100 minutes.

Figure 8:
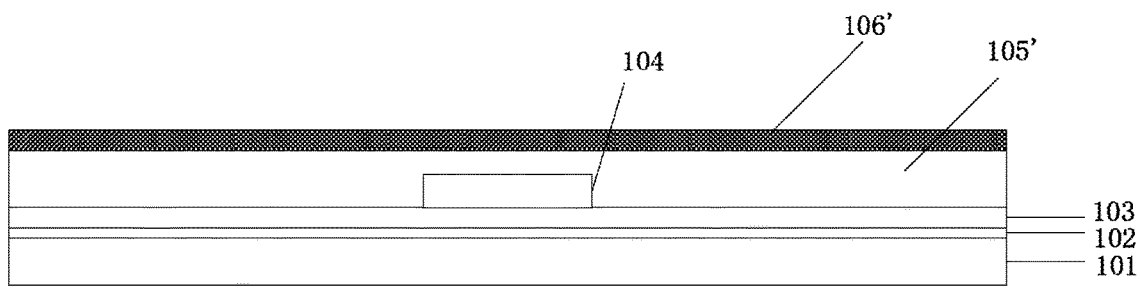

Step S37: referring to FIG. 8, crystallizing the amorphous silicon layer 106 through ELA, so as to form a polysilicon semiconductor layer 106'. To be specific, the ELA process may be performed with an XeCl laser beam having a wavelength of about 308 nm and a layer overlapping ratio of 90% to 98%. After the ELA, the amorphous silicon may be converted into polysilicon under the effect of the laser beam.

Figure 9:
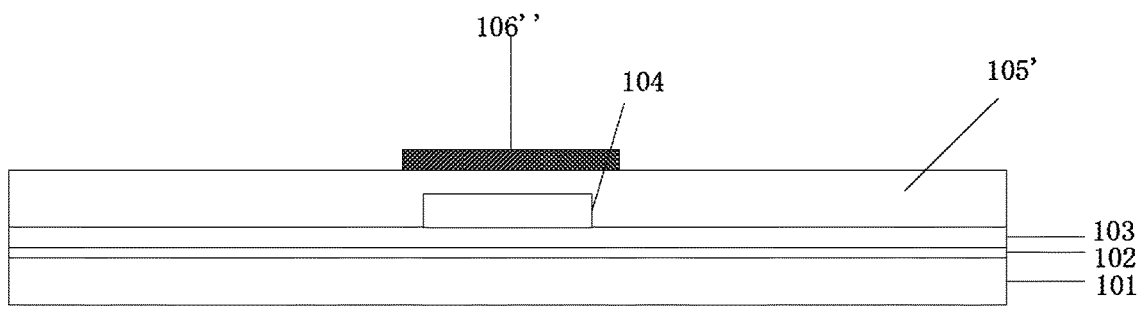

Step S38: referring to FIG. 9, patterning the polysilicon semiconductor layer 106', so as to form a pattern 106" of the polysilicon semiconductor layer.

Figure 10:
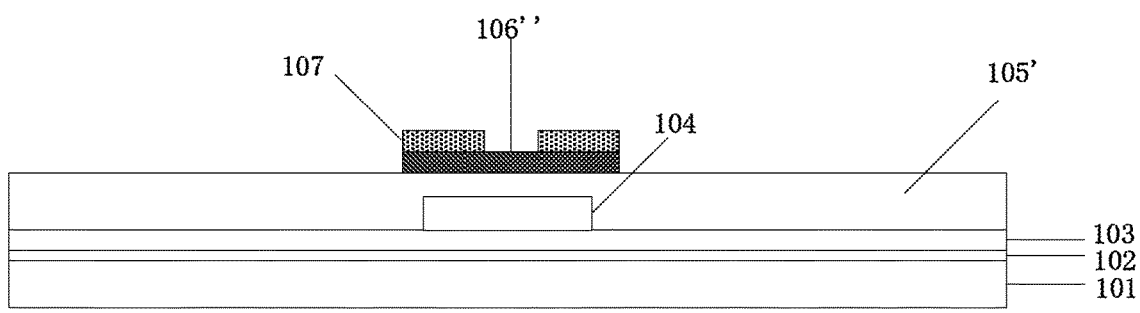

Step S39: referring to FIG. 10, depositing an amorphous silicon highly-doped P+ layer on the polysilicon semiconductor layer, and patterning the amorphous silicon highly-doped P+ layer, so as to form a pattern 107 of the amorphous silicon highly-doped P+ layer. To be specific, the amorphous silicon highly-doped P+ layer having a thickness of 200 Å to 500 Å may be deposited by PECVD at a temperature of less than 400° C. The amorphous silicon highly-doped P+ layer is used to generate excellent ohmic contact between the polysilicon semiconductor layer and the subsequently-formed source/drain electrodes.

Figure 11:
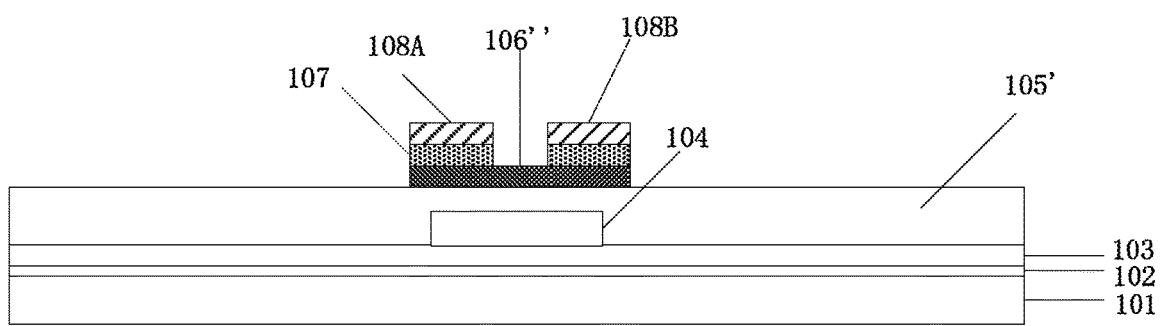

Step S310: referring to FIG. 11, forming patterns of a source electrode 108A and a drain electrode 108B. To be specific, the source electrode and the drain electrode each having a thickness of 1000 Å to 3000 Å may be deposited by magnetron sputtering. The source electrode and the drain electrode may be made of Al, Mo, Cu or W, or an alloy thereof.

Through the above-mentioned steps, it is able to manufacture the flexible LTPS TFT.

The present disclosure further provides in some embodiments a TFT which includes: a base substrate; a gate electrode arranged on the base substrate; a gate insulation layer with an even surface and arranged on the gate electrode; a polysilicon semiconductor layer arranged on the gate insulation layer; and a source electrode and a drain electrode arranged on the polysilicon semiconductor layer.

Optionally, the TFT further includes an amorphous silicon doped layer which is arranged at a source electrode contact region and a drain electrode contact region on the polysilicon semiconductor layer and which is in contact with the source electrode and the drain electrode.

Optionally, the amorphous silicon doped layer is an amorphous silicon highly-doped P+ layer.

Optionally, the base substrate is a flexible base substrate.

The present disclosure further provides in some embodiments an array substrate including the above-mentioned TFT.

The present disclosure further provides in some embodiments a display device including the above-mentioned array substrate.

The above are merely the preferred embodiments of the present disclosure. Obviously, a person skilled in the art may make further modifications and improvements without departing from the spirit of the present disclosure, and these modifications and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for manufacturing a thin film transistor (TFT), comprising steps of:
    forming a pattern of a gate electrode on a base substrate;
    forming a gate insulation layer with an even surface;
    forming a pattern of a polysilicon semiconductor layer;
    depositing an amorphous silicon highly-doped P⁺layer;
    patterning the amorphous silicon highly-doped P⁺layer to form a pattern of the amorphous silicon highly-doped P⁺layer at a source electrode contact region and a drain electrode contact region on the polysilicon semiconductor layer; and
    forming patterns of a source electrode and a drain electrode, wherein the pattern of the amorphous silicon highly-doped P⁺layer contacts directly the patterns of the source electrode and the drain electrode, and the pattern of the amorphous silicon highly-doped P⁺layer contacts directly the polysilicon semiconductor layer;
    wherein the step of forming the pattern of the polysilicon semiconductor layer comprises:
        depositing an amorphous silicon layer;
        patterning the amorphous silicon layer to form a pattern of the amorphous silicon layer; and
        crystallizing the pattern of the amorphous silicon layer to form the pattern of the polysilicon semiconductor layer; and
    wherein the forming the gate insulation layer with the even surface comprises:
        depositing a gate insulation layer film on the base substrate and the pattern of the gate electrode; and
        removing a protrusion on the gate insulation layer film to form the gate insulation layer with the even surface, wherein the distance between an upper surface of the protrusion of the gate insulation layer film and an upper surface of the base substrate is greater than the sum of the thickness of the gate insulation layer with an even surface and the thickness of the gate electrode.

2. The method according to claim 1, wherein the protrusion on the gate insulation layer film is removed by chemical-mechanical polishing.

3. The method according to claim 1, wherein the base substrate is a flexible base substrate.

4. The method according to claim 1, wherein the amorphous silicon layer is crystallized through excimer laser annealing (ELA).

5. The method according to claim 1, wherein prior to the step of forming the gate electrode on the base substrate, the method further comprises depositing a buffer layer made of SiOX or SiNx on the base substrate.

6. A thin film transistor (TFT), comprising:
    a base substrate;
    a gate electrode arranged on the base substrate;
    a gate insulation layer with an even surface arranged on the gate electrode;
    a polysilicon semiconductor layer with an even surface arranged on the gate insulation layer;
    an amorphous silicon highly-doped P⁺layer at a source electrode contact region and a drain electrode contact region on the polysilicon semiconductor layer; and
    a source electrode and a drain electrode arranged on the polysilicon semiconductor layer, wherein the amorphous silicon highly-doped P⁺layer contacts directly the source electrode and the drain electrode, and the amorphous silicon highly-doped P⁺layer contacts directly the polysilicon semiconductor layer.

7. The TFT according to claim 6, wherein the base substrate is a flexible base substrate.

8. The TFT according to claim 6, further comprising a buffer layer arranged on the base substrate.

9. The TFT according to claim 8, wherein the gate insulation layer with the even surface covers the gate electrode and the buffer layer.

10. An array substrate, comprising the TFT according to claim 6.

11. A display device, comprising the array substrate according to claim 10.

* * * * *